(12) United States Patent
Kusumi et al.

(10) Patent No.: US 12,377,579 B2
(45) Date of Patent: Aug. 5, 2025

(54) CUTTING METHOD AND CUTTING DEVICE

(71) Applicant: AKITA PREFECTURE, Akita (JP)

(72) Inventors: Takayuki Kusumi, Akita (JP); Yoichi Akagami, Akita (JP); Masami Echigoya, Akita (JP)

(73) Assignee: AKITA PREFECTURE, Akita (JP)

( * ) Notice: Subject to any disclaimer, the term of this patent is extended or adjusted under 35 U.S.C. 154(b) by 683 days.

(21) Appl. No.: 17/352,412

(22) Filed: Jun. 21, 2021

(65) Prior Publication Data

US 2021/0308905 A1   Oct. 7, 2021

Related U.S. Application Data

(63) Continuation of application No. PCT/JP2019/049487, filed on Dec. 17, 2019.

(30) Foreign Application Priority Data

Dec. 26, 2018 (JP) ................. 2018-243799

(51) Int. Cl.
| | |
|---|---|
| *B28D 5/04* | (2006.01) |
| *B23D 61/18* | (2006.01) |
| *B24B 1/00* | (2006.01) |
| *B24B 27/06* | (2006.01) |
| *B24B 57/02* | (2006.01) |
| *B28D 5/00* | (2006.01) |

(52) U.S. Cl.
CPC .......... *B28D 5/045* (2013.01); *B23D 61/185* (2013.01); *B24B 1/002* (2013.01); *B24B 27/06* (2013.01); *B24B 57/02* (2013.01); *B28D 5/007* (2013.01)

(58) Field of Classification Search
CPC . B28D 1/08; B28D 5/04; B28D 5/042; B28D 5/045; B28D 5/047; B28D 5/007; B24B 1/002; B24B 27/0633; B24B 27/0675; B24B 27/0691; B24B 57/02; B24B 49/10; B23D 57/007; B23D 57/003; B23D 57/0061; B23H 7/101; B23H 7/06; B23H 7/105; B23H 7/02
USPC ...... 125/21; 451/36, 37, 54, 56, 57, 59, 164, 451/165, 168, 296, 304, 305
See application file for complete search history.

(56) References Cited

U.S. PATENT DOCUMENTS

| | | | |
|---|---|---|---|
| 2003/0068964 A1 * | 4/2003 | Akagami | ................ B24B 37/04 451/287 |
| 2016/0368069 A1 * | 12/2016 | Matsubara | ............. B28D 5/045 |

FOREIGN PATENT DOCUMENTS

| | | | | |
|---|---|---|---|---|
| CN | 103056730 | A | | 4/2013 |
| CN | 107186902 | A * | 9/2017 | ......... B24B 27/0633 |

(Continued)

OTHER PUBLICATIONS

Machine Translation WO 2016171018 A1 (Year: 2016).*

(Continued)

*Primary Examiner* — Makena S Markman
(74) *Attorney, Agent, or Firm* — Yokoi & Co., U.S.A.; Toshiyuki Yokoi

(57) ABSTRACT

The cutting method is a cutting method for cutting a workpiece using a wire tool, including: supplying a slurry containing abrasive grains having an electrical dielectric property to a region of the workpiece into which the wire tool cuts; generating an alternating electric field in a region between the wire tool and the workpiece; and running the wire tool along a direction in which the wire tool is drawn while the wire tool abuts on the workpiece.

8 Claims, 9 Drawing Sheets

(56) References Cited

FOREIGN PATENT DOCUMENTS

| CN | 108466156 A | | 8/2018 | | |
|---|---|---|---|---|---|
| JP | H05185364 A | * | 7/1993 | ............. | B28D 5/045 |
| JP | H9-216128 A | | 8/1997 | | |
| JP | 2000158328 A | * | 6/2000 | | |
| JP | 2008-137124 A | | 6/2008 | | |
| JP | 2010-74056 A | | 4/2010 | | |
| JP | 2012-143847 A | | 8/2012 | | |
| JP | 2013-52463 A | | 3/2013 | | |
| JP | 2014-113677 A | | 6/2014 | | |
| JP | 2015-9346 A | | 1/2015 | | |
| JP | 2016-198847 A | | 12/2016 | | |
| WO | 2009-048099 A1 | | 4/2009 | | |
| WO | WO-2016171018 A1 | * | 10/2016 | ............... | B08B 3/08 |

OTHER PUBLICATIONS

Machine Translation JP 2000158328 A (Year: 2000).*
Machine Translation CN 107186902 A (Year: 2017).*
Machine Translation JP H05185364 A (Year: 1993).*
International Search Report issued in PCT/JP2019/049487 mailed on Mar. 17, 2020 with English Translation (8 pages).

* cited by examiner

CUTTING METHOD AND CUTTING DEVICE

CROSS-REFERENCE TO RELATED APPLICATIONS

This application is a continuation application of PCT international application No. PCT/JP2019/049487, filed on Dec. 17, 2019, which designated the United States, and which claims the benefit of priority from Japanese Patent Application No. 2018-243799, filed on Dec. 26, 2018. The entire contents of these applications are incorporated herein by reference.

BACKGROUND OF THE INVENTION

Field of the Invention

The present invention relates to cutting methods and cutting devices for cutting hard-brittle materials such as semiconductor ingots.

Description of the Related Art

In recent years, a performance improvement of power device semiconductors has been needed in order to improve electric-energy utilization efficiency. For this reason, materials, such as silicon carbide (SiC), gallium nitride (GaN), and diamond, are attracting attention as semiconductor (wide-gap semiconductor) materials having a bandgap wider than that of silicon (Si) which is often used as a power device semiconductor.

Incidentally, the steps of wafer-machining the semiconductor ingot mainly include a cutting (slicing) step, a grinding step, a lapping step, and a polishing step. As for the cutting step, a cutting technique using a wire tool and abrasive grains has conventionally been known.

For example, JP2010-74056 A discloses a method of manufacturing a semiconductor wafer in which a plurality of wire rows is formed by winding a wire between rollers arranged with a predetermined interval therebetween, the wire rows are moved while being pressed against a crystalline ingot, and the crystalline ingot is sliced into a plurality of semiconductor wafers. In JP2010-74056 A, a wire having abrasive grains fixed to its surface is used, and the slicing is performed while a predetermined lubricant is supplied to the wire. Such cutting method is also referred to as a fixed-abrasive-grain method.

Further, JP2012-143847 A discloses a unidirectional-traveling type wire-saw including: at least two groove rollers that are formed with a plurality of wire grooves spaced apart in the length direction, wherein wire rows are created by bridging a wire between the groove rollers via the plurality of wire grooves; and a wire running only in one direction between the groove rollers while maintaining the wire row. In JP2012-143847 A, a slurry containing loose abrasive grains is supplied to a portion of a wire row on the upstream side of a pressing position where an ingot is pressed against to cut the ingot. Such cutting method is also referred to as a loose-abrasive-grain method.

JP2013-52463 A discloses a wire-saw device for cutting a workpiece in which a fixed-abrasive-grain wire having abrasive grains fixed to an outer peripheral surface of a wire core line is made to run while a slurry containing loose abrasive grains is supplied to the fixed-abrasive-grain wire.

BRIEF SUMMARY OF THE INVENTION

A cutting method according to an aspect of the present invention is a cutting method for cutting a workpiece using a wire tool, including: supplying a slurry containing abrasive grains having an electrical dielectric property to a region of the workpiece into which the wire tool cuts; generating an alternating electric field in a region between the wire tool and the workpiece; and running the wire tool along a direction in which the wire tool is drawn while the wire tool abuts on the workpiece.

A cutting device according to another aspect of the present invention is a cutting device for cutting a workpiece using a wire tool, including: a wire holding part configured to hold the wire tool so as to be at a predetermined tension; a slurry supply part configured to supply a slurry containing abrasive grains to a region of the workpiece into which the wire tool cuts; electric field generators configured to generate an alternating electric field in a region between the wire tool and the workpiece; wire running unit configured to run the wire tool along a direction in which the wire tool is drawn; and feeding unit configured to move at least one of the wire tool and the workpiece relative to the other of the wire tool and the workpiece such that the wire tool abuts on the workpiece during a cutting step.

The above-described, or other features, advantages and technical and industrial significance of the present invention, will be better understood by reading the following detailed description of the preferred embodiments of the present invention while considering the attached drawings.

DETAILED DESCRIPTION OF THE INVENTION

Hereinafter, a cutting method and a cutting device according to embodiments of the present invention will be described with reference to the drawings. It should be noted that the present invention is not limited by these embodiments. In the description of each drawing, the same portions are denoted by the same reference numbers.

The drawings referred to in the following description are merely schematic representations of shape, size, and positional relationship to the extent that the content of the present invention may be understood. In other words, the present invention is not limited only to the shapes, sizes, and positional relationships exemplified in the respective figures. In addition, the drawings may also include, among themselves, portions having different dimensional relationships and ratios from each other.

Figure 1:
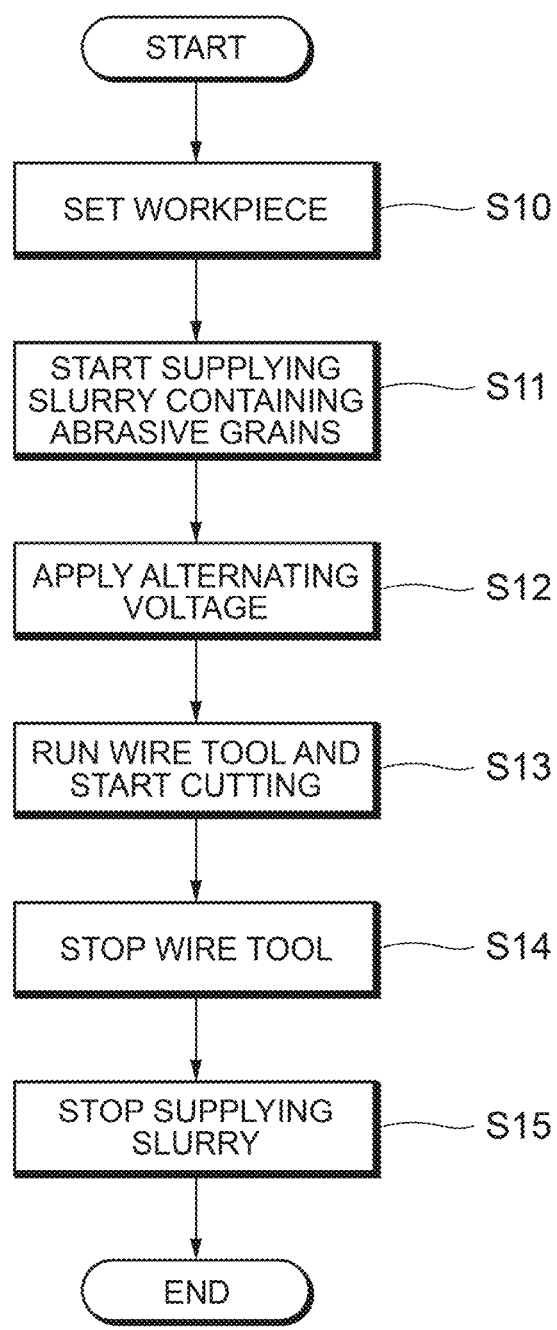
FIG. 1 is a flowchart showing a cutting method according to an embodiment of the present invention.
Figure 2:
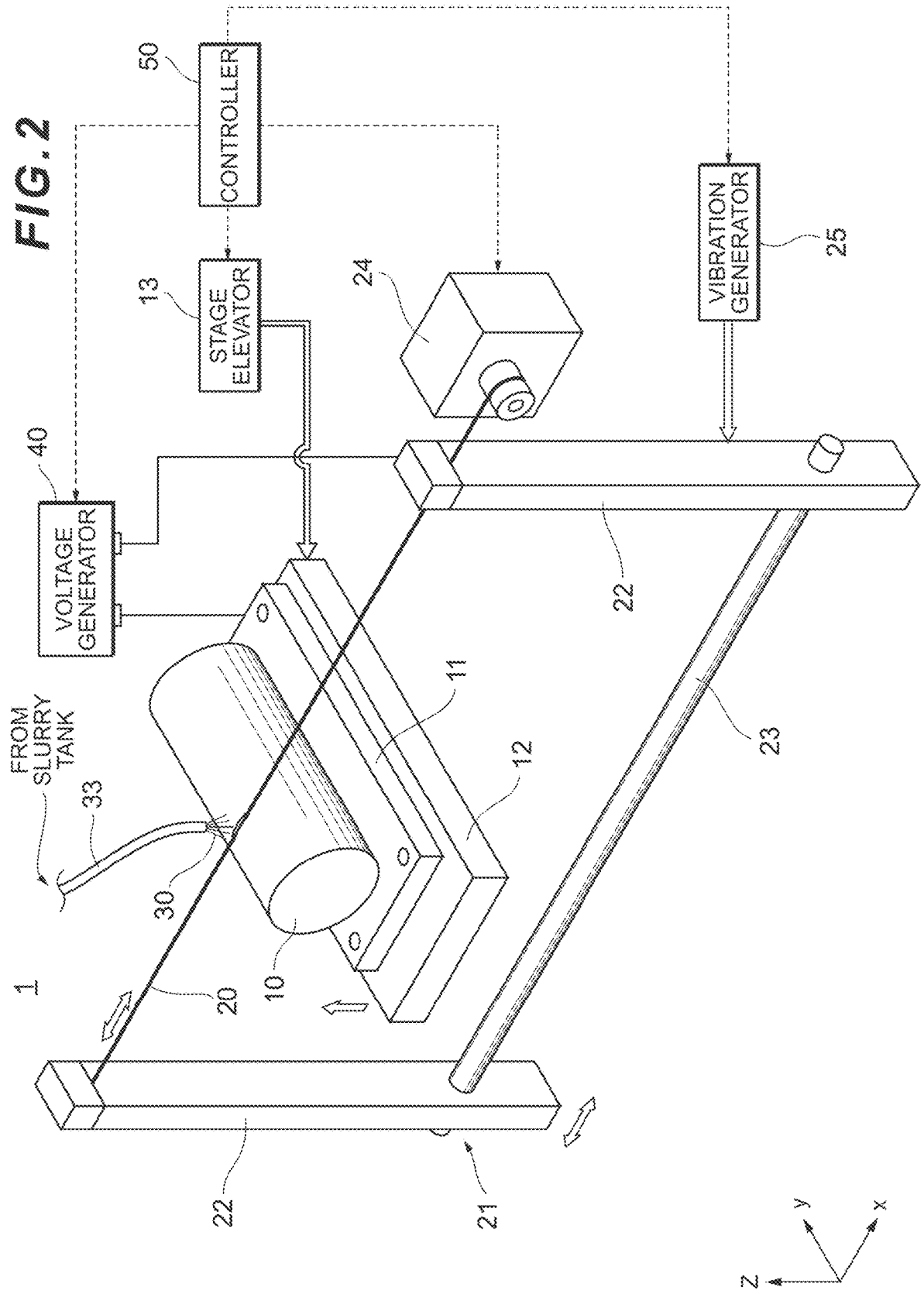
FIG. 2 is a schematic diagram illustrating a schematic configuration of a cutting device according to an embodiment of the present invention.
Figure 3:
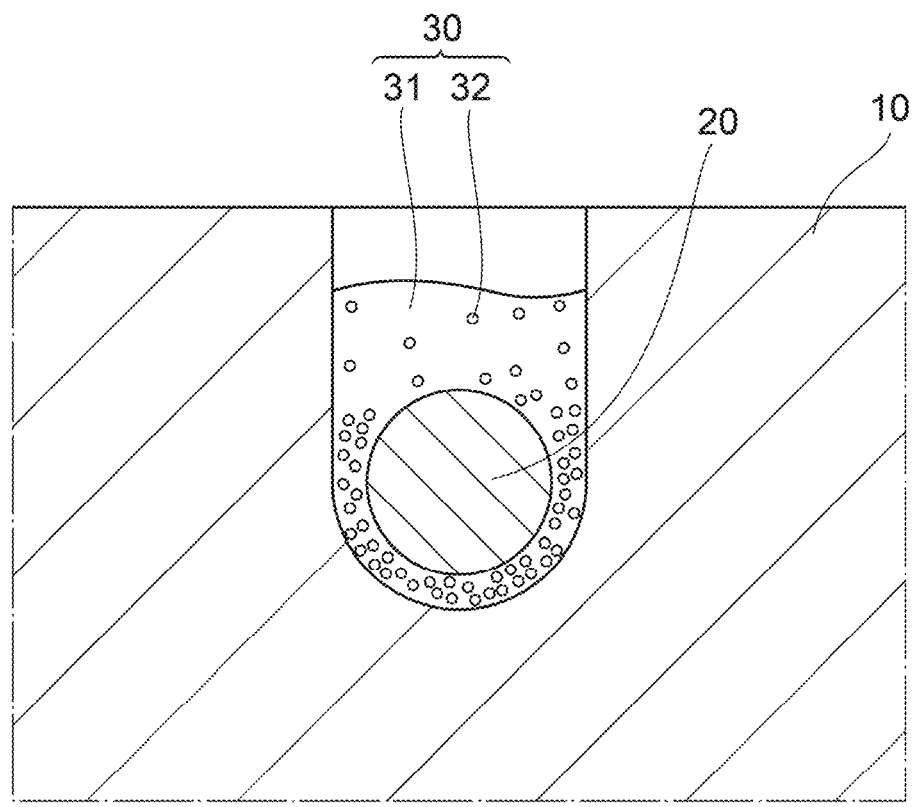
FIG. 3 is a schematic diagram for explaining the principle of a cutting method according to an embodiment of the present invention.

FIG. 1 is a flowchart showing a cutting method according to an embodiment of the present invention. FIG. 2 is a schematic diagram illustrating a schematic configuration of a cutting device according to an embodiment of the present invention. FIG. 3 is a schematic diagram for explaining the principle of a cutting method according to an embodiment of the present invention.

The cutting method according to the present embodiment is a method of cutting a workpiece using a wire tool and a slurry containing abrasive grains, and performs cutting in a state in which an alternating electric field is generated in a region between the wire tool and the workpiece. The workpiece that can be cut in the present embodiment is not particularly limited as long as it can be cut by a general cutting method using a wire tool and slurry. Specific examples include, in addition to semiconductors such as silicon (Si), silicon carbide (SiC), gallium nitride (GaN), and diamond: hard-brittle materials such as glass, sapphire, and ceramics; magnetic materials; metals; alloys; and the like. Details of each step shown in FIG. 1 will be described later.

A cutting device 1 shown in FIG. 2 includes a workpiece holding part 11 for holding a workpiece 10, an elevating stage 12 on which the workpiece holding part 11 is fixed, a stage elevator 13 for elevating and lowering the elevating stage 12, a wire holding part 21 for holding a wire tool 20 so as to be at a predetermined tension, a vibration generator 25 for vibrating the wire holding part 21, a slurry supply part 33 for supplying a slurry 30 containing abrasive grains to a region of the workpiece 10 into which the wire tool 20 cuts, and a voltage generator 40 for applying a voltage between the wire tool 20 and the workpiece 10. The cutting device 1 may further include a controller 50 for controlling the operation of each of these components. In the following, the direction in which the wire tool 20 is drawn is defined as the x direction, and the direction (vertical direction) of feeding the workpiece 10 in the cutting step is defined as the z direction (positive in the upward direction).

The workpiece holding part 11 is a plate member made of, for example, metal or alloy and is fastened to the elevating stage 12 by bolts or the like. In the present embodiment, the workpiece 10 is fixed to the workpiece holding part 11 by an electrically conductive adhesive. However, the configuration of the workpiece holding part 11 and the fixation method of the workpiece 10 are not limited thereto. By way of example, the workpiece 10 may be mechanically held by surrounding the outer peripheral surface of the workpiece 10 from four sides. Further, a cutting dynamometer may be provided to the workpiece holding part 11 and the feed speed of the workpiece 10 (i.e., the moving speed of the elevating stage 12 in the z direction) may be adjusted based on the output value of the cutting dynamometer.

The electric stage elevator 13 for elevating and lowering the elevating stage 12 along the z direction is connected to the elevating stage 12. The elevating stage 12 and the stage elevator 13 are feeding unit for moving the workpiece 10 in the z direction such that the wire tool 20 abuts on the workpiece 10 during the cutting step. In the present embodiment, the stage elevator 13 elevates the elevating stage 12 under the control of the controller 50 at a predetermined speed. Further, the elevating stage 12 may be provided with a positioning mechanism for performing position adjustment in the x-y plane.

The wire tool 20 is a wire-saw obtained by coating the surface of a wire (piano wire) made of metal or alloy, such as steel, with an insulating layer. Here, a wire with its surface being coated with an insulating layer is used for insulating the workpiece and slurry from the wire. The insulating layer can be provided, for example, by coating the core line of the wire with an insulating material such as a resin or by forming a non-conductive film such as an oxide film on the surface of the core line. Further, as the wire tool 20, a so-called fixed-abrasive-grain wire can be used in which abrasive grains are fixed to the wire surface or the insulating layer.

By way of example, the wire holding part 21 includes two supports 22 for holding the wire tool 20, the supports being arranged to face each other with a predetermined interval therebetween, and a support connecting part 23 for connecting these supports 22. Further, the wire tool 20 is provided, on one end side thereof, with a wire tension adjusting part 24 for adjusting the tension of the wire tool 20.

The vibration generator 25 for vibrating, as a whole, the wire tool 20 and the wire holding part 21 for holding the same along the x direction, is connected to the wire holding part 21. The vibration generator 25 is wire running unit for running the wire tool 20 in the direction in which the wire tool 20 is drawn. In the present embodiment, the workpiece 10 is cut by reciprocating the wire tool 20 in small increments in the x direction with the vibration generator 25. The slurry supply part 33 is, for example, a tube with an opening provided at the tip and discharges the slurry 30 supplied from a slurry tank to the region of the workpiece 10 into which the wire tool 20 cuts.

The voltage generator 40 is electric field generator for generating an alternating electric field in the region between the wire tool 20 and the workpiece 10. In FIG. 2, it is assumed that a voltage is applied between the wire tool 20 (strictly, the core line inside the insulating layer) and the workpiece 10 via one of the supports 22 (the left side in the figure) and the work holding part 11. However, if the workpiece 10 is electrically conductive, the voltage may be applied directly to the wire tool 20 and the workpiece 10.

The controller 50 is constructed by, for example, a general-purpose computer, and the controller 50 monitors and controls the operation of the wire tension adjusting part 24, the vibration generator 25, the stage elevator 13 and the voltage generator 40. The controller 50 may be provided with a display part for displaying the monitoring results (e.g., the tension of the wire tool 20) of the operation of the respective components and operation input means for inputting various instructions and set values.

However, the configuration of the cutting device to which the cutting method according to the present embodiment can be applied is not limited to the configuration shown in FIG. 2. For example, as the wire holding part, a mechanism for forming a plurality of wire rows by winding a wire tool between the rollers arranged with a predetermined interval therebetween (see, for example, JP2010-74056 A, JP2012-143847 A, JP2013-52463 A, etc.) may be employed. In this case, a plurality of slices can be simultaneously acquired.

Further, as the wire running unit, a mechanism for running a wire tool in one direction by rotating the rollers in one direction may be employed in the mechanism for forming a plurality of wire rows by winding a wire tool between the rollers. Alternatively, the wire tool may be run in a reciprocated manner by reversely rotating the rollers after rotating the rollers in one direction.

In addition, the arrangement of the workpiece holding part 11 and the elevating stage 12 is not limited to the arrangement shown in FIG. 2. For example, the workpiece holding part may be arranged on the upper side (the +z side in FIG. 2) of the wire tool to hold the workpiece from above, and the workpiece may be cut by feeding the workpiece holding part downward (the −z direction in FIG. 2).

Furthermore, in the configuration shown in FIG. 2, it is assumed that the position of the wire tool 20 is fixed and the workpiece 10 is fed toward the wire tool 20. However, the position of the workpiece 10 may be fixed and the wire tool 20 may be fed toward the workpiece. Alternatively, both the workpiece 10 and the wire tool 20 may be moved in opposite directions.

Next, the slurry 30 used in the present embodiment will be described. As shown in FIG. 3, the slurry 30 is obtained by dispersing abrasive grains 32 in a dispersion medium 31 having a viscosity in a predetermined range. As the dispersion medium 31, an insulating liquid such as water (pure water) or silicon oil (e.g., a viscosity of 1 to 1000 cSt at 20° C.) is used.

As the abrasive grains 32, particles having a hardness equal to or higher than the hardness of the workpiece 10, or particles that cause a mechanochemical reaction with the workpiece, are used, and the particles are made of at least one selected from the group of: an insulator having an electrical dielectric property; a semiconductor; and a metal or an alloy. The dielectric constant of the abrasive grains 32 is preferably higher than the dielectric constant of the dispersion medium 31. The diameter of the abrasive grains 32 may be appropriately set depending on the diameter of the wire tool 20 and machining width, etc.

Specifically, the material of the abrasive grains 32 can be appropriately selected from diamond, corundum, emery, garnet, silica stone, calcined dolomite, fused alumina, artificial emery, silicon carbide, zirconium oxide, cubic boron nitride cBN, chromium oxide, silicon oxide, iron oxide, calcium oxide, magnesium oxide, cerium oxide, magnesium carbide, barium carbonate, and the like, in relation to the material of the workpiece 10. Alternatively, abrasive grains made of a plurality of types of materials may be used. For example, it is possible to use abrasive grains of a composite material in which a central portion (core portion) of an abrasive grain is coated with a material different from the material of the core portion. In this case, as a material of the coating side (shell portion), a material having a cut rate higher than that of the material of the core portion with respect to the workpiece 10 is used. Specifically, examples of materials for the core portion include titanium metal-complex oxides such as strontium titanate ($SrTiO_3$) and barium titanate ($BaTiO_3$). As a material of the shell portion, for example, metal oxide, carbide, nitride, boride, or diamond is used. Specific examples include iron oxide, manganese oxide, silicon dioxide (silica, $SiO_2$), cerium oxide (ceria), diamond (C), aluminum oxide (alumina, $Al_2O_3$), titanium oxide (titania, $TiO_2$), zirconium oxide (zirconia, $ZrO_2$), boron carbide ($B_4C$), cubic boron nitride (cBN), silicon carbide (SiC), and the like.

When preparing the slurry 30, abrasive grains 32 are mixed in the dispersion medium 31, and the abrasive grains 32 are uniformly dispersed so that they will not agglomerate by using an ultrasonic homogenizer or the like.

Next, the cutting method according to the present embodiment will be described.

First, in step S10, the workpiece 10 to be machined is set in the cutting device 1. Specifically, the workpiece 10 is fixed to the workpiece holding part 11 by using an electrically conductive adhesive or the like, and the workpiece holding part 11 is fastened to the elevating stage 12. Then, by adjusting the position and height of the elevating stage 12, the cutting area of the workpiece 10 is arranged in the vicinity of the wire tool 20.

In the subsequent step S11, the supply of the slurry 30 containing the abrasive grains 32 is started toward the cutting area of the workpiece 10. Further, in step S12, an alternating electric field is generated in the region between the workpiece 10 and the wire tool 20 by applying an alternating voltage between the workpiece 10 and the wire tool 20. Conditions such as amplitude, frequency or waveform of the alternating voltage to be applied are appropriately set according to various conditions such as the materials of the workpiece 10 and the wire tool 20, as well as the material of the slurry 30 and the diameter of the abrasive grains.

In the subsequent step S13, cutting of the workpiece 10 is started by running the wire tool 20. The feed speed of the workpiece 10 (moving speed of the elevating stage 12) is appropriately set according to various conditions such as the materials of the workpiece 10 and the wire tool 20, the running speed of the wire tool 20 (the period if the wire tool is to be vibrated by the vibration generator 25), and a machining width.

Thereafter, when the cutting of the set range is completed, the running of the wire tool 20 is stopped (step S14), and the supply of the slurry 30 is also stopped (step S15). Thereby, a series of cutting steps of the workpiece 10 is completed.

In this way, when an alternating electric field is generated while the slurry 30 is supplied to the region of the workpiece 10 into which the wire tool 20 cuts, the abrasive grains 32 in the slurry 30 gather in the region between the wire tool 20 and the workpiece 10 (see FIG. 3) by way of dielectrophoresis. At this time, since an alternating electric field is applied to the slurry 30, the abrasive grains 32 are substantially uniformly arranged in the region without being agglomerated unevenly. Therefore, the wire tool 20 can be made to run smoothly while a state is maintained in which sufficient abrasive grains 32 are present around the wire tool 20, and cutting can therefore be proceeded with good machining efficiency.

At this time, the abrasive grains 32 gather around the wire tool 20 due to the force generated by the alternating electric field, and the abrasive grains 32 move and flow in the slurry around the wire tool 20, and therefore, damage to the cut surface of the workpiece 10 as in the general fixed-abrasive-grain cutting method is not caused. In other words, the cutting can be performed with at least the same degree of machining quality as, or higher than that of, the general loose-abrasive-grain cutting method.

It should be noted that, if the frequency of the voltage to be applied is less than 0.1 Hz, there is a possibility that the fluidity of the slurry 30 as a fluid will be reduced, or the abrasive grains 32 will be agglomerated. Further, if the direct current voltage is applied, there is a possibility that the abrasive grains 32 will be agglomerated on either side of the wire tool 20 or the workpiece 10 and there is also a possibility that the rolling property of the abrasive grains will be reduced.

Hereinafter, the advantages of the cutting method according to the present embodiment will be described.

The total machining time of the steps of wafer-machining a semiconductor ingot generally amounts to more than 60 hours, of which the cutting step accounts for 60-70% of the total machining time. In particular, a wide-gap semiconductor material, such as silicon carbide, is a difficult-to-machine material that is mechanically and chemically stable and has a higher hardness relative to silicon, thereby increasing the machining time in the cutting step. For this reason, a cutting technique capable of shortening the machining time without degrading the machining quality has been desired.

However, in a typical loose-abrasive-grain cutting method, damage to a workpiece may be relatively small and machining costs may be relatively low, but the cutting efficiency is low. Accordingly, it cannot be said that it is not very suitable for cutting a workpiece having a high hardness such as silicon carbide.

On the other hand, in a typical fixed-abrasive-grain cutting method, although cutting may be performed at a relatively high speed, the cut surface is changed in property due to machining, whereby damage to a workpiece is large. Accordingly, the load in the subsequent polishing step is increased, and in turn a large amount of machining time is needed as a whole. Further, there are also situations where the price of the wire tool having abrasive grains fixed thereto is high and where the fixation quality of the abrasive grains to the wire tool affects the machining quality of the workpiece.

Further, in general, in a method of performing cutting using a wire tool having abrasive grains fixed to its surface while a slurry containing abrasive grains is supplied, although it may be possible for the machining efficiency to be improved as compared to the above-described typical loose-abrasive-grain method, the machining quality may be degraded as compared to the typical loose-abrasive-grain method.

In contrast, in the cutting method according to the present embodiment, since an alternating electric field is generated in the region between the wire tool and the workpiece, the abrasive grains contained in the supplied slurry gather in the region between the wire tool and the workpiece, and the abrasive grains are substantially uniformly arranged in such region without being unevenly agglomerated. The wire tool can therefore be made to run smoothly while a state is maintained in which the abrasive grains are arranged sufficiently in the vicinity of the wire tool. Thus, according to the present embodiment, in the cutting method using the wire tool, it is possible to cut the workpiece more efficiently than before and without degrading the machining quality.

(Experiment of Principle)

Figure 4:
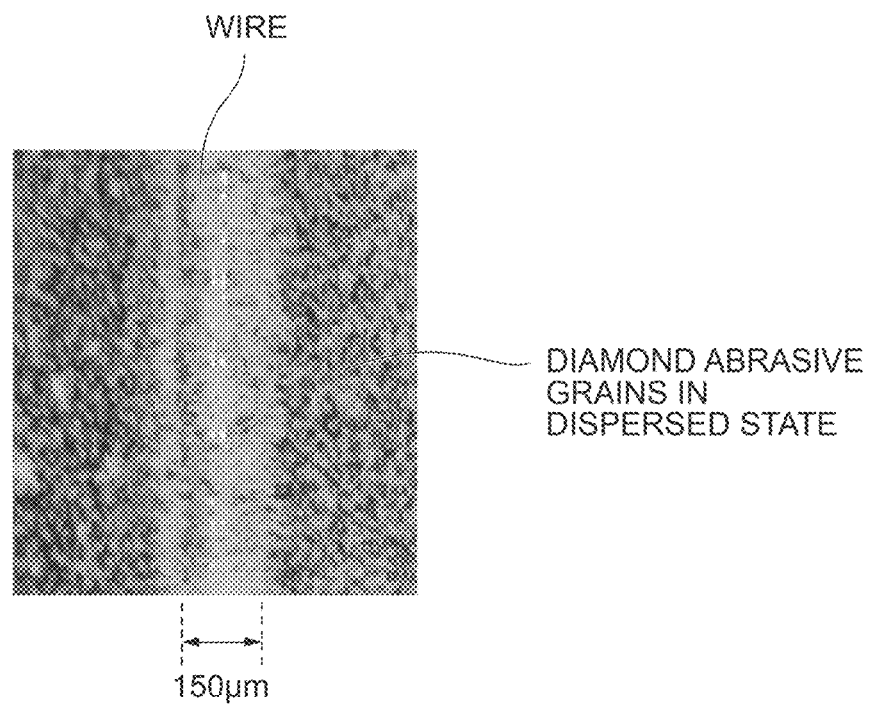
FIG. 4 is an image showing the behavior (a state in which an electric field is not generated) of the abrasive grains in the vicinity of the wire tool.
Figure 5:
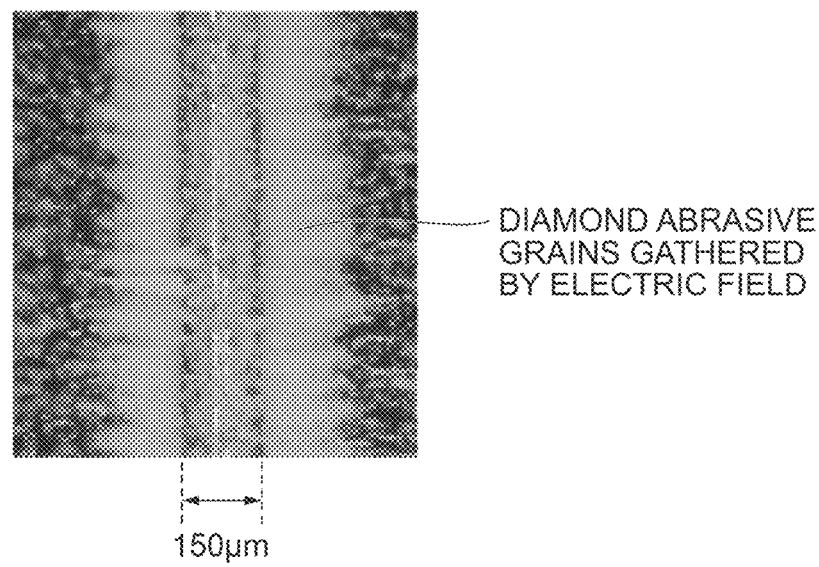
FIG. 5 is an image showing the behavior (a state in which an electric field is generated) of the abrasive grains in the vicinity of the wire tool.

An experiment was performed to observe the behavior of abrasive grains by generating an alternating electric field in the vicinity of a wire tool by applying an alternating voltage to the wire tool in a state in which the wire tool is immersed in a slurry containing the abrasive grains. The experiment conditions are as follows:

Slurry
    Dispersion medium: Dimethyl silicone oil with 10 cSt
    Abrasive grain: Diamond abrasive grain with a particle size of 20 to 30 µm
    Wire tool: Resin-coated steel wire with a diameter of 150 µm
    Workpiece: Slide glass
    Workpiece side electrode: Aluminum plate
    Applied voltage: +2 kV, 6 Hz square wave The experiment method was as follows. Specifically, the slide glass was placed on the aluminum plate installed horizontally, and the wire tool was arranged horizontally on the slide glass. An alternating electric field was formed by applying an alternating voltage between the aluminum plate and the wire tool while the slurry was dripped on the main surface of the slide glass. In this state, an image was acquired by performing imaging by enlarging the surface vicinity of the wire tool with a microscope and a camera installed above the slide glass. FIGS. 4 and 5 are images showing the behavior of the abrasive grains in the vicinity of the wire tool. Of these, FIG. 4 shows a state with no electric field and FIG. 5 shows a state in which the electric field is generated.

As shown in FIG. 4, in the state with no electric field, the diamond abrasive grains are dispersed throughout the slurry. In contrast, as shown in FIG. 5, in the state in which the electric field is generated, the diamond abrasive grains gather in the vicinity of the wire, and the diamond abrasive grains are substantially uniformly arranged in the region where they gathered without being unevenly agglomerated.

(Cutting Experiment)

Experiments 1 to 4 were performed in which a workpiece was cut by the cutting method according to the present embodiment, and the machining efficiency and the machining quality were evaluated. The experiment conditions in each experiment were as follows:

Experiment 1
Slurry
    Dispersion medium: Dimethyl silicone oil with 10 cSt
    Abrasive grain: Diamond abrasive grain with a particle size of 2 to 4 µm
    Abrasive grain concentration: 1 wt %
    Dripping rate: 50 µL/min
    Wire tool: Resin-coated steel wire with a diameter of 160 µm
Applied voltage
    Amplitude: ±0.5 kV
    Frequency: 0 V (no electric field), 3 Hz, 6 Hz, 15 Hz, 30 Hz
    Waveform: Square wave Experiment 2
Slurry
    Dispersion medium: Dimethyl silicone oil with 10 cSt
    Abrasive grain: Diamond abrasive grain with a particle size of 5 to 10 µm
    Abrasive grain concentration: 1 wt %
    Dripping rate: 50 µL/min
    Wire tool: Resin-coated steel wire with a diameter of 160 µm
Applied Voltage
    Amplitude: ±0.5 kV
    Frequency: 0 V (no electric field), 3 Hz, 6 Hz, 15 Hz, 30 Hz
    Waveform: Square wave Experiment 3
Slurry
    Dispersion medium: Dimethyl silicone oil with 10 cSt
    Abrasive grain: Diamond abrasive grain with a particle size of 5 to 10 µm
    Abrasive grain concentration: 1 wt %
    Dripping rate: 50 µL/min
    Wire tool: Resin-coated steel wire with a diameter of 160 µm
Applied Voltage
    Amplitude: ±1.0 kV
    Frequency: 0 V (no electric field), 3 Hz, 6 Hz, 15 Hz, 30 Hz
    Waveform: Square wave Experiment 4
Slurry
    Dispersion medium: Dimethyl silicone oil with 10 cSt
    Abrasive grain: Diamond abrasive grain with a particle size of 2 to 4 µm
    Abrasive grain concentration: 1 wt %
    Dripping rate: 30 µL/min Wire tool: Fixed-abrasive-grain wire having diamond abrasive grains with a particle size of 12 to 25 μm fixed on a wire with a diameter of 150 μm having a resin coat around a core line with a diameter of 120 μm Applied Voltage
  Amplitude: ±0.5 kV
  Frequency: 0 V (no electric field), 3 Hz, 6 Hz, 30 Hz
  Waveform: Square wave The experiment conditions common to Experiments 1 to 4 were as follows:
  Wire tool tension: 8 N
  Wire tool line speed: 2.52 m/min
  Workpiece: Cylindrical silicon ingot with a diameter of 10 mm
  Workpiece feed speed: 23 μm/min
  Processing time: 10 minutes In Experiments 1 to 4, the evaluation of machining efficiency was performed by measuring the cutting depth into the workpiece (depth of a groove formed in the workpiece) when machining was performed for 10 minutes. The evaluation of the machining quality was performed by measuring the roughness Ra of the cut portion (inner surface of the groove). Here, the roughness of the inner surface of the groove cannot be said to directly represent the quality of the cut surface; however, it can be an index representing the smoothness of the motion of the wire tool relative to the workpiece. For example, if the inner surface of the groove is rough, saw marks caused by deflection and the like at the time of cutting are generated, and it is considered that the quality of the cut surface is degraded.

Figure 6:
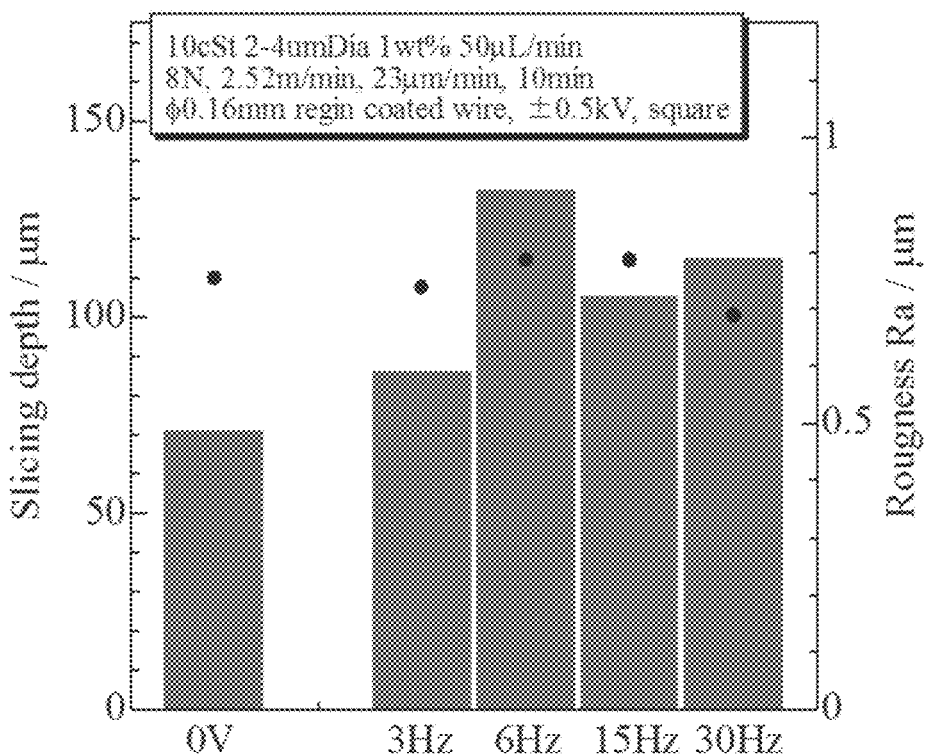
FIG. 6 is a graph showing the results of Experiment 1.
Figure 7:
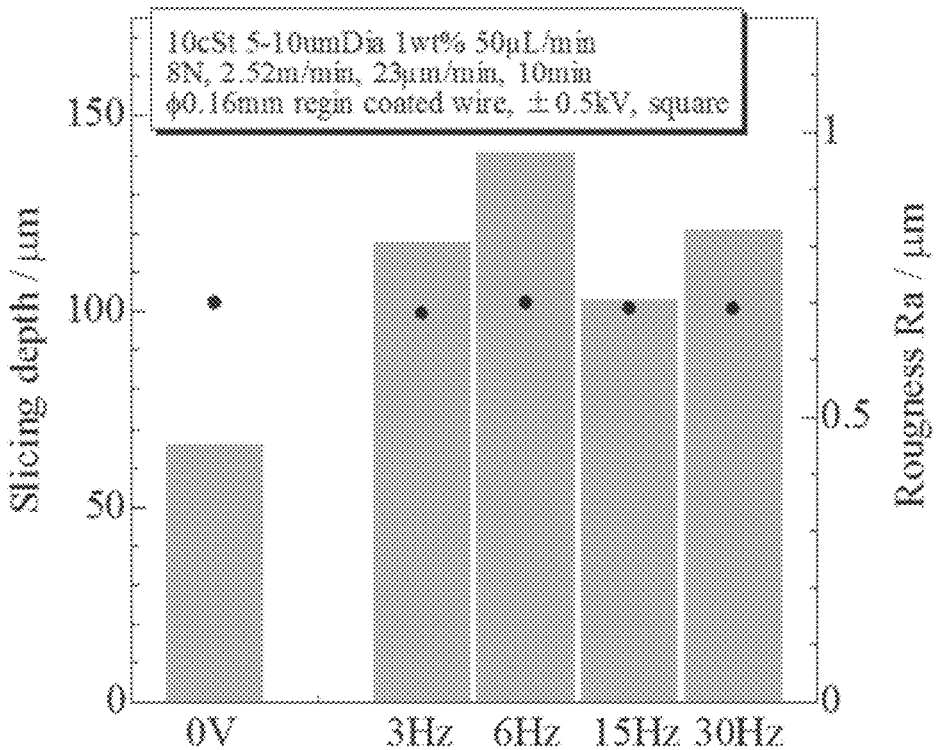
FIG. 7 is a graph showing the results of Experiment 2.
Figure 8:
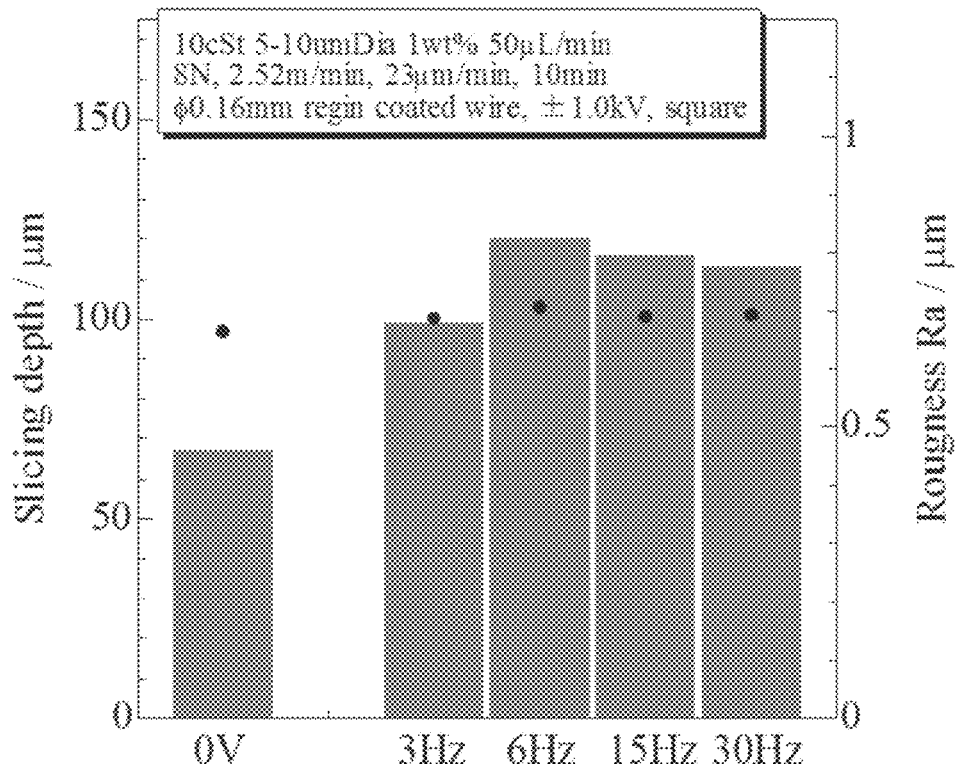
FIG. 8 is a graph showing the results of Experiment 3.
Figure 9:
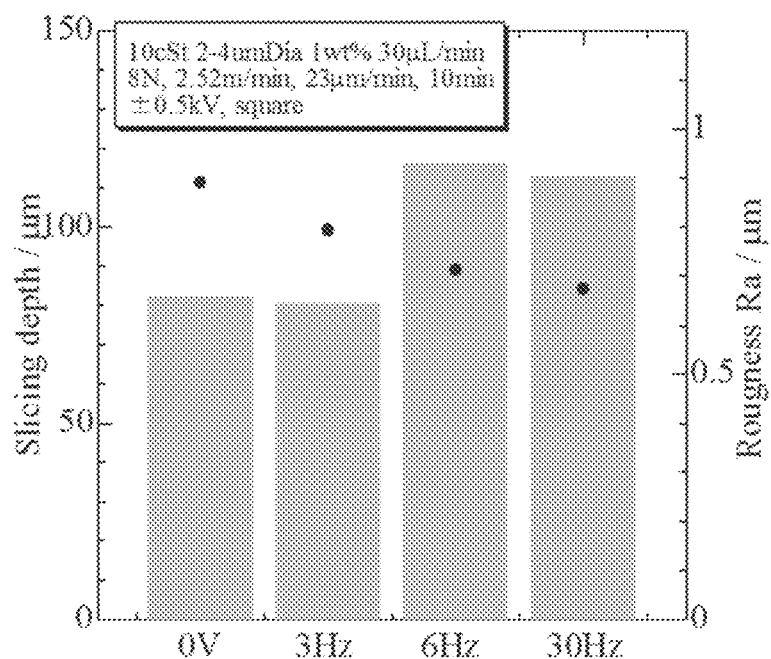
FIG. 9 is a graph showing the results of Experiment 4.

FIG. 6 is a graph showing the results of Experiment 1, FIG. 7 is a graph showing the results of Experiment 2, FIG. 8 is a graph showing the results of Experiment 3, and FIG. 9 is a graph showing the results of Experiment 4. In Experiments 1 to 4, the bar chart shows the depth of cut into the workpiece (Slicing depth, (μm)) and the plotted points show the roughness of the cut portion (Rougness (Ra, μm)).

As shown in FIGS. 6 to 9, in any of the experiments, in most cases, the cutting depth was increased by generating an electric field. For example, when the frequency was 6 Hz, the cutting depth was increased by about 86% in Experiment 1 (see FIG. 6), by about 110% in Experiment 2 (see FIG. 7), by about 79% in Experiment 3 (see FIG. 8), and by about 42% in Experiment 4 (see FIG. 9), as compared to the case where the electric field is not generated (frequency 0 Hz). From this, it was confirmed that an improvement in machining efficiency is achieved by generating the electric field.

Considering the frequency dependency of machining efficiency, in most cases, it can be seen that the cutting depth increases significantly when the frequency is 3 Hz or more. Under the above-mentioned experiment conditions, in any of the experiments, the cutting depth is the largest, in particular, in the vicinity of 6 Hz. On the other hand, when the frequency exceeds 30 Hz, the cutting depth is reduced. From this, it can be seen that the frequency of the alternating electric field may be set preferably between 3 Hz and 30 Hz, inclusive, more preferably greater than 3 Hz and less than 15 Hz, and even more preferably in the vicinity of 6 Hz in order to improve the machining efficiency under the conditions of Experiments 1 to 4.

Considering the particle size of the abrasive grains to be dispersed in the slurry, the cutting depth was increased by 86% when the frequency was 6 Hz in Experiment 1 (particle size 2 to 4 μm, see FIG. 6), whereas the cutting depth was increased by 110% when the frequency was 6 Hz in Experiment 2 (particle size 5 to 10 μm, see FIG. 7). From this, it can be said that, under the conditions of Experiments 1 and 2, when the particle size of the abrasive grains is large, a further improvement in machining efficiency can be obtained.

Considering the voltage dependency of machining efficiency, the cutting depth was increased by 110% when the frequency was 6 Hz in Experiment 2 (voltage ±0.5 kV, see FIG. 7), whereas the cutting depth was increased by 79% when the frequency was 6 Hz in Experiment 3 (voltage ±1.0 kV, see FIG. 8). From this, it was found that high voltage is not necessarily advantageous for achieving an improvement in machining efficiency.

As for the machining quality, in Experiments 1 to 3 (see FIGS. 6 to 8) using only loose abrasive grains, no significant variation in the roughness Ra of the cut portion was found when the electric field was generated as compared to the case where the electric field was not generated. From this, it was confirmed that, when cutting is performed using loose abrasive grains, no degradation in machining quality is caused and an improvement in machining efficiency can be achieved. On the other hand, in Experiment 4 (see FIG. 9) using loose abrasive grains and fixed abrasive grains, the roughness Ra of the cut portion was reduced when the electric field was generated as compared to the case where the electric field was not generated, and it can therefore be seen that the roughness is improved. That is, it was confirmed that, when using a fixed-abrasive-grain wire, not only an improvement in machining efficiency but also an improvement in machining quality was achieved by generating the electric field.

(Particle Size Dependency of the Cutting Efficiency)

Figure 10:
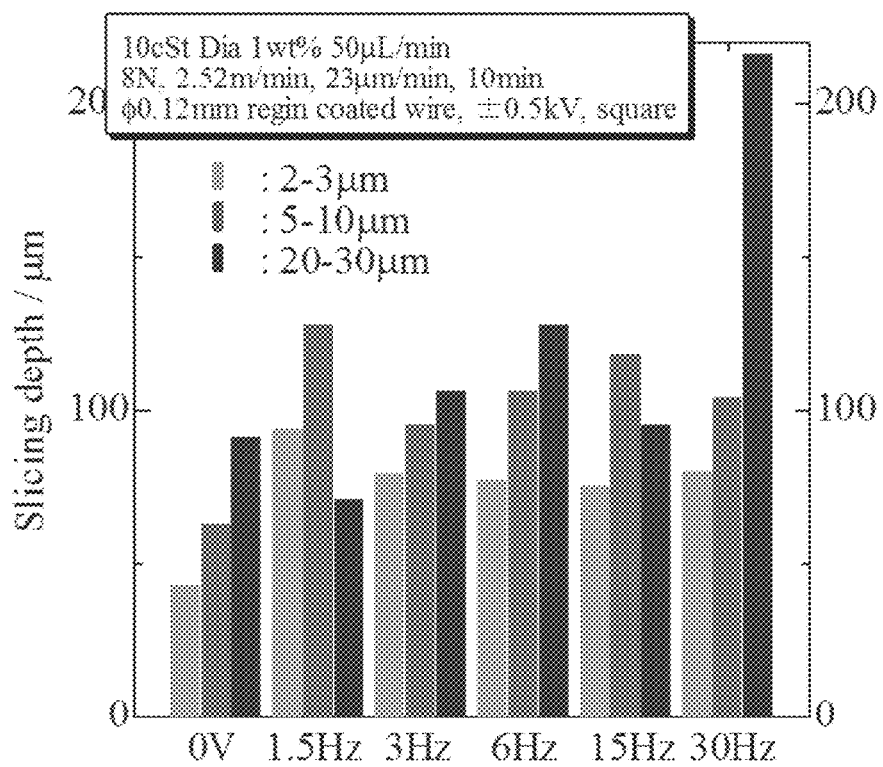
FIG. 10 is a graph showing the results of Experiment 5.
Figure 11:
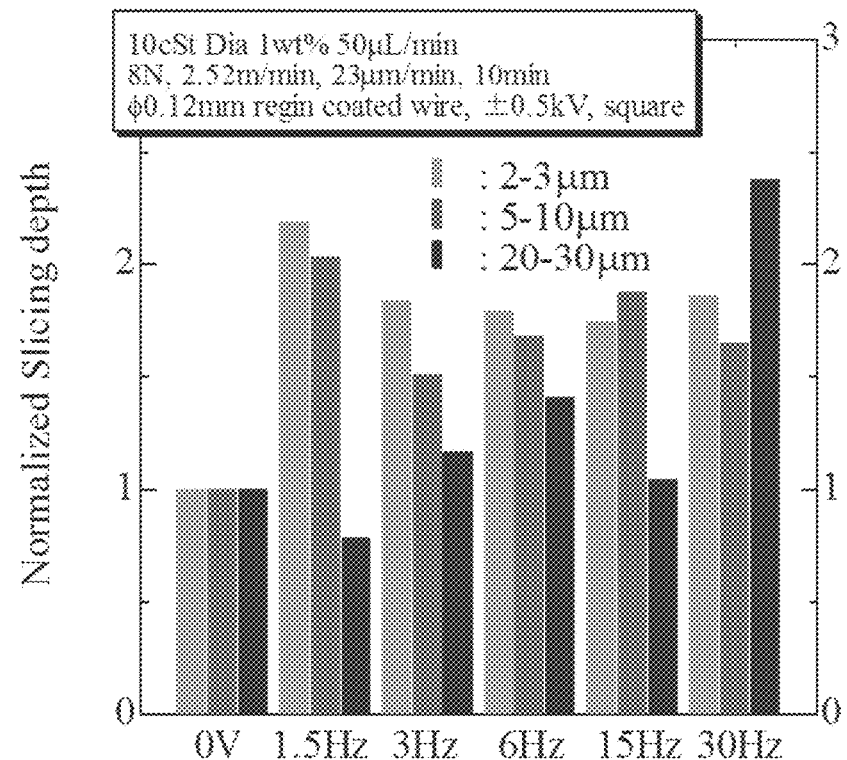
FIG. 11 is a graph showing the normalized results of Experiment 5.

In the cutting method according to the present embodiment, Experiment 5 was performed in which the workpiece was cut by changing the diameter of the abrasive grains contained in the slurry, and the dependency of the cutting efficiency on the grain diameter was evaluated. The experiment conditions were as follows:

Experiment 5
Slurry
  Dispersion medium: Dimethyl silicone oil with 10 cSt
  Abrasive grain: Diamond abrasive grain
    Particle size: 3 types: 2 to 3 μm, 5 to 10 μm, and 20 to 30 μm
  Abrasive grain concentration: 1 wt %
  Dripping rate: 50 μL/min
Wire tool: Resin-coated steel wire with a diameter of 120 μm
Tension: 8 N
Line speed: 2.52 m/min
Workpiece: Cylindrical silicon ingot with a diameter of 10 mm
Feed speed: 23 μm/min
Processing time: 10 minutes
Applied voltage
  Amplitude: ±0.5 kV
  Frequency: 0 V (no electric field) to 30 Hz
  Waveform: Square wave FIG. 10 is a graph showing the results of Experiment 5. FIG. 11 is a graph obtained by normalizing the results of Experiment 5, for each particle size, with reference to the cutting depth when no voltage is applied. As shown in FIGS. 10 and 11, it can be seen that, in most cases, the cutting depth is increased by generating the electric field, regardless of the particle size. In particular, in the cases of small grain size (2 to 3 μm) and medium grain size (5 to 10 μm), the cutting depth is increased by more than 1.5 times as compared to the case where the electric field is not generated, regardless of the frequency of the electric field. Further, when the low frequency of the electric field is applied (e.g. 6 Hz or less), it can be said that the smaller the particle size, the more remarkable the improvement in the cutting efficiency tends to be.

(Dispersion Medium Viscosity Dependency of the Cutting Efficiency)

Figure 12:
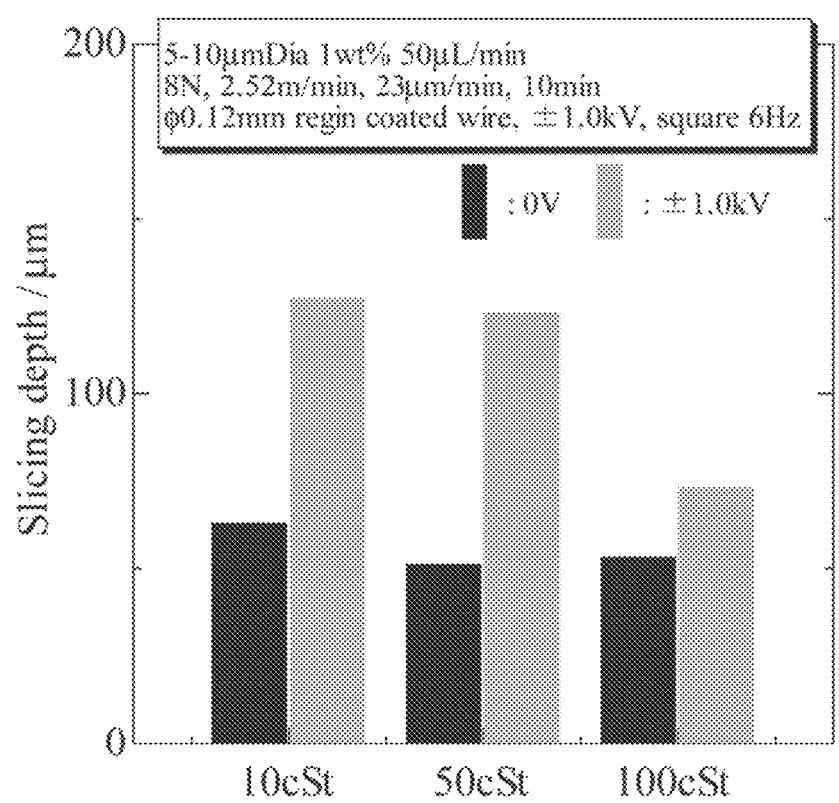
FIG. 12 is a graph showing the results of Experiment 6.

In the cutting method according to the present embodiment, Experiment 6 was performed in which the workpiece was cut by changing the viscosity of the dispersion medium contained in the slurry, and the dependency of the cutting efficiency on the dispersion medium viscosity was evaluated. The experiment conditions were as follows:

Experiment 6
Slurry
 Dispersion medium: Dimethyl silicone oil
  Viscosity: 3 types: 10 cSt, 50 cSt, and 100 cSt
 Abrasive grain: Diamond abrasive grain with a particle size of 5 to 10 μm
 Abrasive grain concentration: 1 wt %
 Dripping rate: 50 μL/min
 Wire tool: Resin-coated steel wire with a diameter of 120 μm
 Tension: 8 N
 Line speed: 2.52 m/min
 Workpiece: Cylindrical silicon ingot with a diameter of 10 mm
 Feed speed: 23 μm/min
 Processing time: 10 minutes
 Applied voltage
  Amplitude: ±1.0 kV
  Frequency: 0 V (no electric field), 6 Hz
  Waveform: Square wave FIG. 12 is a graph showing the results of Experiment 6. As shown in FIG. 12, in the viscosity range of 10 to 100 cSt of the dispersion medium, although there was a difference in degree depending on the viscosity, in any case, the cutting depth was increased by generating the electric field, and it was found that an improvement in cutting efficiency can be achieved.

(Electric Field Frequency Dependency of the Cutting Efficiency)

Figure 13:
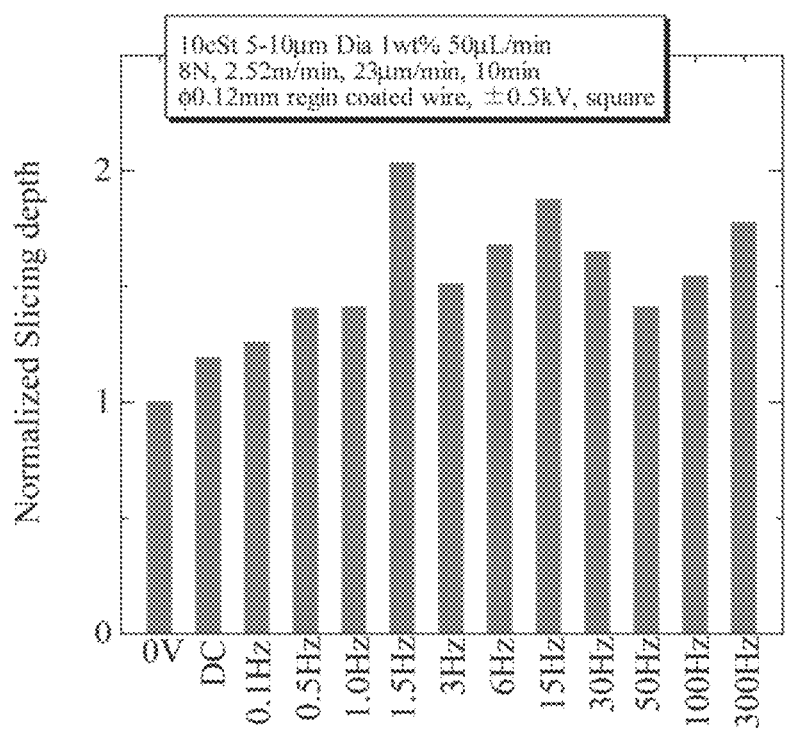
FIG. 13 is a graph showing the results of Experiment 7.

In the cutting method according to the present embodiment, Experiment 7 was performed in which the workpiece was cut by changing the frequency of the electric field, and the dependency of the cutting efficiency on the electric field frequency was evaluated. The experiment conditions were as follows:

Experiment 7
Slurry
 Dispersion medium: Dimethyl silicone oil with 10 cSt
 Abrasive grain: Diamond abrasive grain with a particle size of 5 to 10 μm
 Abrasive grain concentration: 1 wt %
 Dripping rate: 50 μL/min
 Wire tool: Resin-coated steel wire with a diameter of 120 μm
 Tension: 8 N
 Line speed: 2.52 m/min
 Workpiece: Cylindrical silicon ingot with a diameter of 10 mm
 Feed speed: 23 μm/min
 Processing time: 10 minutes
 Applied voltage: 0 V (no electric field), direct current, alternating current
  Amplitude: ±0.5 kV
  Frequency: 0.1 to 300 Hz
  Waveform: Square wave FIG. 13 is a graph showing the results of Experiment 7 and it shows the cutting depths at the respective frequencies of a direct current and an alternating current, which is normalized with reference to the cutting depth at a voltage of 0 V. As shown in FIG. 13, the cutting efficiency was slightly improved when a direct-current electric field was generated as compared to the case where the electric field was not generated. However, the cutting efficiency was further improved when an alternating-current electric field was generated. For example, when the frequency was 0.1 Hz, the cutting efficiency was improved by about 30% with respect to the case where the electric field was not generated. Further, when the frequency was 0.5 Hz or more, the cutting efficiency was improved by more than 40% with respect to the case where the electric field was not generated. Of these, when the frequency was 1.5 Hz or more, although there were some variations, it can be seen that the cutting efficiency was significantly improved. Further, under the above-mentioned experiment conditions, good cutting efficiency was obtained, in particular, in the vicinity of the frequency of 1.5 Hz.

As described above, according to the embodiments of the present invention, it is possible to cut a workpiece more efficiently than before and without degrading the machining quality. Therefore, it is possible to efficiently produce a slice with good quality even when machining, for example, a wide-gap semiconductor material having a high hardness such as silicon carbide.

The present invention as thus far described is not limited to the above-mentioned embodiments and modifications, and various inventions can be formed by appropriately combining a plurality of components disclosed in the above-mentioned embodiments and modifications. For example, such various inventions may be formed by excluding some components from all components shown in the above-mentioned embodiments and modifications, or by appropriately combining the components shown in the above-mentioned embodiments and modifications.

Further advantages and modifications may be easily conceived of by those skilled in the art. Accordingly, a wider aspect of the present invention is not limited to the particular details and representative embodiment described herein. Accordingly, various modifications can be made to the present invention without departing from the spirit or scope of the general idea of the invention defined by the appended claims and equivalents thereof.

What is claimed is:

1. A cutting method for cutting a workpiece using a wire tool, comprising:
supplying a slurry containing abrasive grains having an electrical dielectric property to a region of the workpiece into which the wire tool, which includes a wire made of a metal or an alloy and an insulating layer formed on a surface of the wire, cuts;
generating an alternating electric field in a region between the wire tool and the workpiece by way of connecting an electrode electrically to the wire located inside the insulating layer of the wire tool, connecting another electrode electrically to the workpiece, and applying an alternating voltage having a frequency of 0.1 Hz to 30 Hz between the wire tool and the workpiece; and
running the wire tool along a direction in which the wire tool is drawn while the wire tool abuts on the workpiece, wherein
the slurry includes an insulating liquid having a viscosity in a predetermined range, the alternating voltage is applied between the wire located inside the insulating layer and the workpiece in a state that the slurry is supplied to the region between the wire tool and the workpiece to apply the alternating electric field to the insulating liquid and the abrasive grains which are contained in the slurry in a state that the workpiece and the slurry are insulated from the wire by the insulating layer.

2. The cutting method of claim 1, wherein the wire tool further includes second abrasive grains fixed to the wire or the insulating layer.

3. The cutting method of claim 1, wherein the workpiece is electrically conductive.

4. A cutting device for cutting a workpiece using a wire tool, comprising:
- a wire holder configured to hold the wire tool so as to be at a predetermined tension;
- a slurry supplier configured to supply a slurry containing abrasive grains to a region of the workpiece into which the wire tool, which includes a wire made of a metal or an alloy and an insulating layer formed on a surface of the wire, cuts;
- a voltage generator configured to apply an alternating voltage having a frequency of 0.1 Hz to 30 Hz between the wire tool and the workpiece for generating an alternating electric field in a region between the wire tool and the workpiece, wherein an electrode is electrically connected to the wire located inside the insulating layer of the wire tool and another electrode electrically to the workpiece, and;
- a wire running-actuator configured to run the wire tool along a direction in which the wire tool is drawn; and
- a feeder configured to move at least one of the wire tool and the workpiece relative to the other of the wire tool and the workpiece such that the wire tool abuts on the workpiece during a cutting step, wherein the slurry includes an insulating liquid having a viscosity in a predetermined range, the alternating voltage is applied between the wire located inside the insulating layer and the workpiece in a state that the slurry is supplied to the region between the wire tool and the workpiece to apply the alternating electric field to the insulating liquid and the abrasive grains which are contained in the slurry in a state that the workpiece and the slurry are insulated from the wire by the insulating layer.

5. The cutting device of claim 4, wherein the wire running actuator includes a vibration generator for reciprocating the wire tool in small increments along the direction in which the wire tool is drawn, or rollers for running the wire tool, by rotating themselves, in one direction or in a reciprocated manner.

6. The cutting device of claim 4, wherein the feeder includes a stage on which a workpiece holding part is fixed and a stage elevator for elevating and lowering the stage such that the wire tool abuts on the workpiece.

7. The cutting device of claim 4, wherein the wire tool further includes second abrasive grains fixed to the wire or the insulating layer.

8. The cutting device of claim 4, wherein the workpiece is electrically conductive.

* * * * *